(12) United States Patent
Lassmann et al.

(10) Patent No.: US 10,334,718 B2
(45) Date of Patent: Jun. 25, 2019

(54) MULTI-FUNCTIONAL HIGH-CURRENT CIRCUIT BOARD

(71) Applicant: ZF Friedrichshafen AG, Friedrichshafen (DE)

(72) Inventors: Wilfried Lassmann, Hirschau (DE); Michael Sperber, Neukirchen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 119 days.

(21) Appl. No.: 15/037,266

(22) PCT Filed: Oct. 21, 2014

(86) PCT No.: PCT/EP2014/072479
§ 371 (c)(1),
(2) Date: May 17, 2016

(87) PCT Pub. No.: WO2015/074814
PCT Pub. Date: May 28, 2015

(65) Prior Publication Data
US 2016/0286639 A1 Sep. 29, 2016

(30) Foreign Application Priority Data

Nov. 21, 2013 (DE) .................. 10 2013 223 761
Nov. 22, 2013 (DE) .................. 10 2013 223 888

(51) Int. Cl.
*H05K 7/00* (2006.01)
*H05K 1/02* (2006.01)
(Continued)

(52) U.S. Cl.
CPC ..... *H05K 1/0265* (2013.01); *H01L 23/49822* (2013.01); *H01L 23/552* (2013.01);
(Continued)

(58) Field of Classification Search
CPC ......... H01L 2924/0002; H01L 2924/00; H01L 23/49822; H01L 23/552; H05K 1/0218;
(Continued)

(56) References Cited

U.S. PATENT DOCUMENTS 5,436,062 A 7/1995 Schmidt
9,107,295 B2 8/2015 Lassmann et al.
(Continued)

FOREIGN PATENT DOCUMENTS

DE 195 16 547 A1 11/1996
DE 103 32 579 A1 11/2004
(Continued)

OTHER PUBLICATIONS

International Search Report dated Dec. 17, 2014 in International Application No. PCT/EP2014/072479, 4 pages, German Language.
(Continued)

*Primary Examiner* — Yuriy Semenenko
(74) *Attorney, Agent, or Firm* — Brinks Gilson & Lione

(57) ABSTRACT

A multi-functional high current circuit board comprises a current conduction layer having several strata for conduction of electric current, a switching layer comprising at least one power circuit breaker for switching an electric load, a control layer comprising at least one control element to control the at least one power circuit breaker, at least one shielding element for shielding the current conduction layer from the control layer and from the switching layer.

17 Claims, 3 Drawing Sheets

(51) Int. Cl.
*H01L 23/498* (2006.01)
*H01L 23/552* (2006.01)
*H05K 1/09* (2006.01)
*H01L 25/16* (2006.01)

(52) U.S. Cl.
CPC ........... *H01L 25/16* (2013.01); *H05K 1/0218* (2013.01); *H05K 1/0263* (2013.01); *H05K 1/0298* (2013.01); *H05K 1/09* (2013.01); *H01L 2924/0002* (2013.01); *H05K 2201/0723* (2013.01); *H05K 2201/09254* (2013.01); *H05K 2201/09327* (2013.01); *H05K 2201/09736* (2013.01); *H05K 2201/10053* (2013.01); *H05K 2201/10166* (2013.01)

(58) Field of Classification Search
CPC .. H05K 1/0263; H05K 1/0265; H05K 1/0298; H05K 1/09; H05K 2201/0723; H05K 2201/09254; H05K 2201/09327; H05K 2201/09736

See application file for complete search history.

(56) References Cited

U.S. PATENT DOCUMENTS

| | | | |
|---|---|---|---|
| 9,265,148 B2 | 2/2016 | Lassmann et al. | |
| 2003/0137813 A1* | 7/2003 | Onizuka | H05K 1/0263 361/777 |
| 2004/0124493 A1 | 7/2004 | Chua | |
| 2005/0199610 A1* | 9/2005 | Ptasienski | H05B 3/26 219/543 |
| 2005/0225955 A1 | 10/2005 | Grebenkemper | |
| 2007/0069932 A1 | 3/2007 | Isoda | |
| 2008/0075070 A1* | 3/2008 | Goergen | H05K 1/0218 370/360 |
| 2009/0040724 A1* | 2/2009 | Nishikimi | H05K 7/20927 361/699 |
| 2009/0314522 A1* | 12/2009 | Janesch | H05K 1/0203 174/252 |
| 2010/0226098 A1* | 9/2010 | Loibl | F16H 61/0006 361/721 |
| 2011/0051371 A1* | 3/2011 | Azuma | B60K 6/445 361/699 |
| 2012/0181067 A1* | 7/2012 | Wen | H05K 1/0206 174/252 |
| 2013/0063902 A1* | 3/2013 | Yoshida | H05K 1/0209 361/728 |
| 2014/0008105 A1* | 1/2014 | Abe | H05K 1/141 174/251 |
| 2014/0152092 A1 | 6/2014 | Lopez de Arroyabe | |
| 2014/0182898 A1* | 7/2014 | Lassmann | H05K 1/0206 174/252 |

FOREIGN PATENT DOCUMENTS

| | | |
|---|---|---|
| DE | 20 2006 020 504 U1 | 10/2008 |
| DE | WO2012168018 | * 12/2012 |
| WO | WO 03/073812 A1 | 9/2003 |
| WO | WO 2012/022535 A1 | 2/2012 |
| WO | WO 2012/097912 A1 | 7/2012 |

OTHER PUBLICATIONS

International Search Report dated Dec. 17, 2014 in International Application No. PCT/EP2014/072479, 3 pages.

Written Opinion of International Search Authority dated May 28, 2015 in International Application No. PCT/EP2014/072479, 5 pages, German Language.

Search Report dated Mar. 31, 2014 in German Application No. DE 10 2013 223 888.6, 7 pages, German Language, including English Translation of p. 5.

* cited by examiner

MULTI-FUNCTIONAL HIGH-CURRENT CIRCUIT BOARD

CROSS-REFERENCE TO RELATED APPLICATIONS

This application is a filing under 35 U.S.C. § 371 of International Patent Application PCT/EP2014/072479, filed Oct. 21, 2014, and claims the priority of DE 10 2013 223 888.6, filed Nov. 22, 2013 and DE 10 2013 223 761.8, filed Nov. 21, 2013. These applications are incorporated by reference herein in their entirety.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

Field of the Invention

The disclosure relates to a multi-functional high current circuit board.

Background Art

High current circuit boards are known from prior art. High electrical currents can be conducted in the high current circuit board through current conduction layers to power circuit breakers. The high currents flowing through the high current circuit boards cause electromagnetic and/or thermal fields, which exit from a current-conducting layer. These fields affect adjacent layers of the high current circuit board, which are provided for example for the realization of switching signals or for current distribution. It is not possible or possible only to a limited extent to at least partially shield the resulting fields. For this reason, high current circuit boards, in which the function of conducting high currents is combined with the function of controlling circuits for power semiconductors, in particular in the area of fine conductor technology, are not known.

BRIEF SUMMARY OF THE INVENTION

The object of the disclosure is to provide a multi-functional high current circuit board that combines the functions of conducting high currents and controlling circuits for power semiconductors.

To achieve this object, a multi-functional high current circuit board is specified in accordance with the features of claim 1. The high current circuit board includes a current conduction layer comprising a plurality of strata for conducting electrical current, in particular high current, which in particular is at least several 100 A, in particular at least 500 A and in particular at least 1000 A. Furthermore, the high current circuit board comprises a control layer having at least one power circuit breaker for switching an electric load connectable with the high current circuit board and a least one control layer having at least one control element for switching the at least one power circuit breaker. In particular, the switching layer, the current conduction layer and the control layer are arranged one above the other. Furthermore, the high current circuit board comprises at least one shielding element for shielding the current conduction layer from the switching layer and from the control layer. This ensures that high current can be conducted through the current conduction layer having a plurality of strata, and electrical, magnetic and/or thermal fields caused by the current flow can be reliably shielded by the at least one shielding layer. The function of the switching layer, that is switching an electrical load, and the function of the control layer, that is switching the at least one power circuit breaker, are not affected by the current flow in the current conduction layer. The present circuit board enables a targeted shielding and decoupling of the separable individual functions, namely conduction of high current, control, power distribution and switching.

Advantageous embodiments of the high current circuit board result from the features of the dependent claims to claim 1.

A favorable embodiment has a current conduction layer with at least four strata, wherein there are provided at least one current supply stratum to supply current from a voltage source connectable to the high current circuit board, in particular a battery, through the high current circuit board to the electric load connectable with the high current circuit board, in particular an electric motor, and at least one current return path stratum to conduct the current from the electric load through the high current circuit board to the voltage source. It is also possible that more than four strata are provided. In particular, the number of strata is m+n+2, where n is the number of current conduction strata, m indicates the number of current return path strata. The 2 external strata also fulfill shielding functions. In particular, m can be unequal n. The strata make possible to increase the area ratio in the current conduction layer. Possible electrical and/or thermal losses due to the so-called skin effect, according to which current is forced to a conductor surface and thus reduces the effective current-carrying cross-section, are reduced. Even steep-flanked and high-frequency switching operations in the at least one power circuit breaker do not lead to an increase in the electrical line resistance. The electrical line resistance is not increased.

Particularly favorable is a configuration in which the at least four strata are arranged symmetrically in such a way that the electromagnetic fields caused by the strata are oriented opposite to each other.

Particularly advantageous is an arrangement of the four strata in such a way that they are arranged in mirror symmetry to a virtual center layer of the high current circuit board. For example, there are provided a stratum adjacent to the virtual center layer and a current return path stratum separated from the virtual center layer. Because of the symmetrical current conduction, even high currents can be effectively conducted in the strata. For example, an effective elimination of rapidly changing magnetic fields in consequence of a change in the current intensity as a function of time can be achieved.

Favorable is an embodiment in which the at least four strata consist of copper and have a in particular constant layer thickness of about 105 µm to a maximum of 400 µm, in particular 105 µm, 210 µm or 400 µm. By a strata so configured sufficient current can be conducted.

A favorable embodiment is an embodiment where the at least two current supply strata have a variable cross-section area along a circuit board-internal current conduction direction. A circuit board-internal current conduction direction is in particular directed from the at least one power circuit breaker to the at least one control element. In the circuit board-internal current conduction direction, the strata sectional area is at least partially designed in a decreasing tendency. In the circuit board-internal current return path direction, the strata sectional area is at least partially designed in an increasing tendency. In particular, the circuit board-internal current return path direction leads from the at least one power circuit breaker to the at least one control element. This ensures a geometric current distribution. This means that a proper and/or required current supply to the respective power circuit breakers and current return conduction from the respective power circuit breakers is possible. The respective stratum sectional area is adapted to the required current conducted through the stratum. This means that the higher the current to be conducted in the stratum, the greater is the stratum sectional area. The current supply stratum is appropriately matched to the connected power circuit breaker. The stratum sectional area can be selectively reduced where no high currents exist. This allows avoidance of too large-sized stratum sectional areas. Too large-sized stratum sectional areas require increased space. The disclosed high current circuit board can be carried out in a physically small, compact design. Likewise, it is avoided that the stratum sectional area is too small. A stratum sectional area required for the current conduction is ensured. This allows avoidance of the resulting power dissipation and heat. The inventors have therefore recognized that a constant stratum sectional area in the circuit board-internal current supply direction and/or the circuit board-internal current return direction is physically unnecessary and inappropriate. Advantageously, the stratum sectional area in the circuit board-internal current supply direction and/or the circuit board-internal power return direction is adapted to the respective requirements of the current conduction. The disclosed high current circuit board can be operated in an energy-saving way.

Favorable is a configuration with a first shielding element for shielding the current conduction layer from the switching layer and with a second shielding element for shielding the current conduction layer from the control layer. Thus, a central arrangement of the current conduction layer between the switching layer and the control layer is possible. Such high current circuit board is robustly designed.

Particularly favorable is a configuration in which the first shielding element is the stratum of the current conduction layer adjacent to the switching layer and/or the second shielding element is the stratum of the current conduction layer adjacent to the control layer. In particular, the first shielding element and the second shielding element are each designed as a current return conduction stratum. The two out-board strata in the current conduction layer serve for shielding. These strata enable functional integration. In particular, it is not necessary to integrate separate shielding elements in the high current circuit board.

Advantageous is an embodiment in which the switching layer comprises at least two switching layer thin strata, whereby on one, in particular external, i.e., at a first switching layer thin stratum on an outer side of the high current circuit board, is installed the at least one power circuit breaker. The first switching layer thin stratum is conductively connected to a, in particular inner, second switching layer thin stratum. In particular, the first switching layer thin stratum and the second layer thin stratum are electrically and/or thermally conductively connected to each other.

A particularly advantageous embodiment is such that the at least two switching layer thin strata are joined together by at least one interlayer connection. Such an interlayer connection is also called a vertical interconnect access (VIA). The at least one interlayer connection can be produced as micro-VIA, in particular by laser drilling. In particular, at least one interlayer connection is filled with copper. Such interlayer connection is also known as micro-VIA-fill. By the copper filling, the copper content of the external switching layer thin strata is increased. The electrical and thermal connection between the two switching layer thin strata is thereby improved. The heat generated in the power circuit breakers can be conducted with a low impedance by the two switching layer thin strata. The generated heat can thus be divided between the two switching layer thin strata. This division is also referred to as the heat dissipation principle. This makes it possible to dispense with conventional thermal interlayer connections or at least reduce the number of thermal interlayer connections. The copper-filled interlayer connections enlarge a joint surface, through which the high current circuit board can be connected by means of a heat conducting medium to a heat sink. This makes possible an effective cooling of the high current circuit board, in particular the power circuit breaker.

Advantageous is an embodiment in which the switching layer thin strata are each composed of copper and have a, in particular constant, layer thickness of about 12 µm to a maximum of 70 µm, in particular 12 µm, 18 µm, 35 µm, or 70 µm. The thin strata are simple and inexpensive to produce. The thin strata are adapted to the expected requirements with respect to the conduction of current.

Advantageous is an embodiment, in which the control layer comprises at least two control layer thin strata, wherein on a particular external control layer thin stratum, i.e. a stratum disposed on an outer side of the high current circuit board, the at least one control element is mounted. The first control layer thin stratum is electrically connected to a particular internal second control layer thin stratum. In particular, the control layer thin strata are electrically and/or thermally conductively connected with one another.

Particularly advantageous is an embodiment in which the at least two control layer thin strata are interconnected by at least one interlayer connection, especially in the form of a laser-drilled micro-VIA. The at least one interlayer connection is designed in particular to be hollow.

Both the features specified in the claims and the features specified in the following exemplary embodiment of the disclosed high current circuit board are suitable, each one alone or in combination with each other, to further develop the object of the disclosure. The respective combinations of features do not limit the further developments of the subject matter of the disclosure, but have only an exemplary character in all material respects.

BRIEF DESCRIPTION OF THE SEVERAL VIEWS OF THE DRAWINGS

Further features, advantages and details of the disclosure will become apparent from the following description of an embodiment with reference to the drawing. The figures shown.

DETAILED DESCRIPTION OF THE INVENTION

Figure 1A:
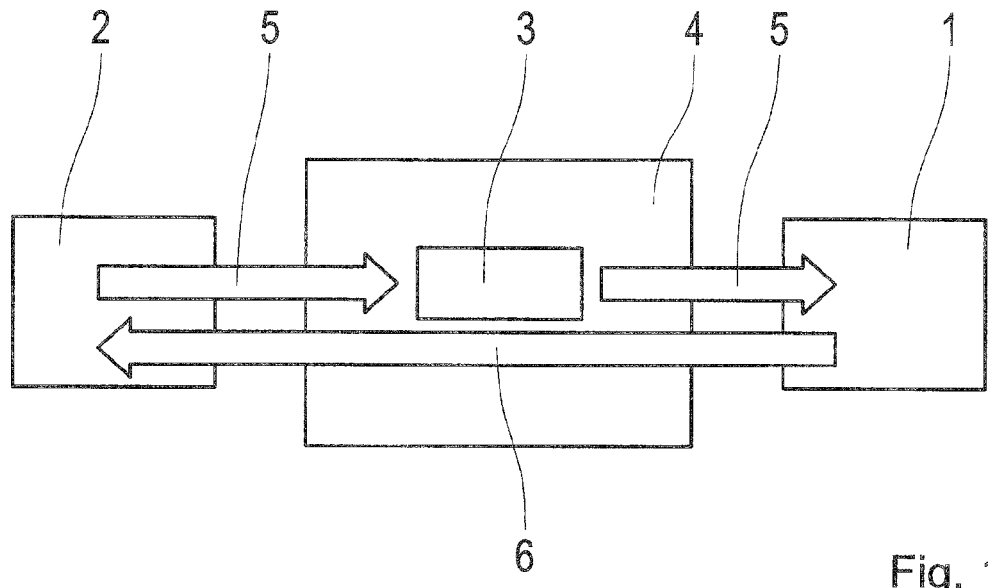
FIG. 1 shows a schematic representation of an electrical circuit with a high current circuit board according to the disclosure.

Mutually corresponding parts in FIGS. 1 to 4 are provided with the same reference numerals. Also the details of the embodiment explained below may in them-selves constitute a disclosure or be part of the subject of the disclosure.

Figure 1B:
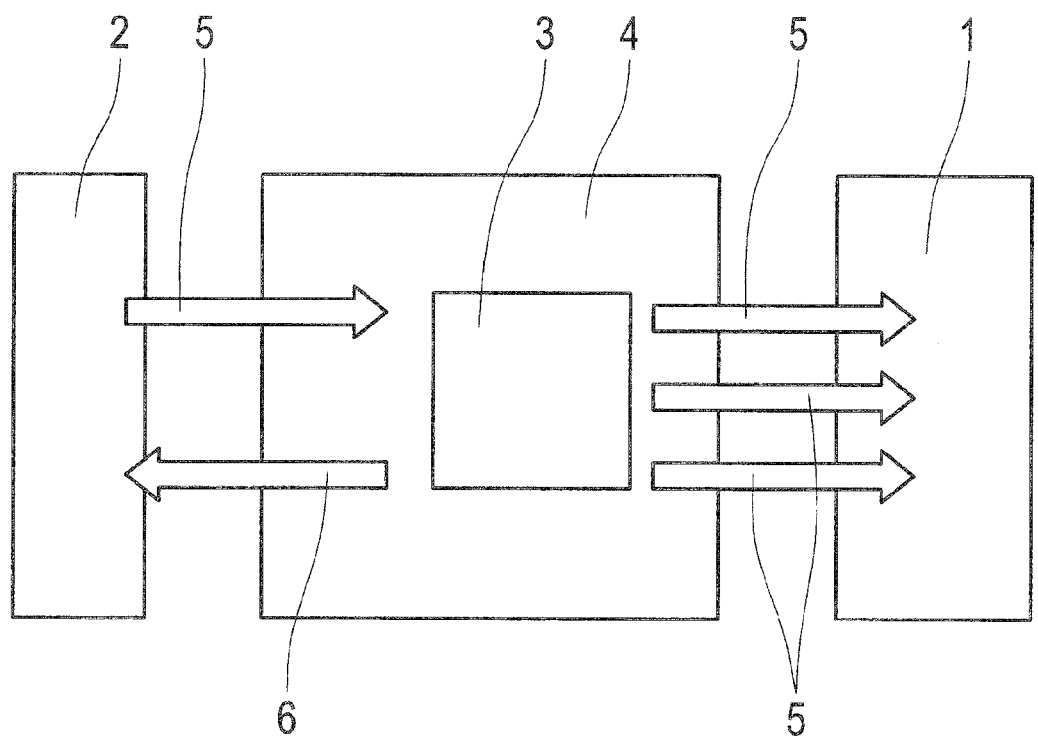

FIG. 1a and FIG. 1b show a schematic arrangement of an electric circuit, in which an electric load 1, in particular an electric motor, is supplied with electric voltage from a voltage source 2, in particular a battery. The current supply from the voltage source 2 to the electric load 1 is performed by a switching operation by at least one power circuit breaker 3 of a high current circuit board 4. A current supply line 5 connects the voltage source 2 to the high current circuit board 4. A current return line 6 connects the electric load 1 through the high current circuit board 4 to the voltage source 2. By closing the at least one power circuit breaker 3, a current flow from the voltage source 2 via the power circuit breaker 3 to the electric load 1 and back again is made possible. The high current circuit board 3 provides the current supply and current return up to a system limit, for example, a contact or a plug (not shown).

FIG. 1a shows that a current supply line 5 connects the high current circuit board 4 to the electric load 1. FIG. 1b shows that three current supply lines 5 connect the high current circuit board 4 to the electric load, in particular a 3-phase electric load.

Figure 2:
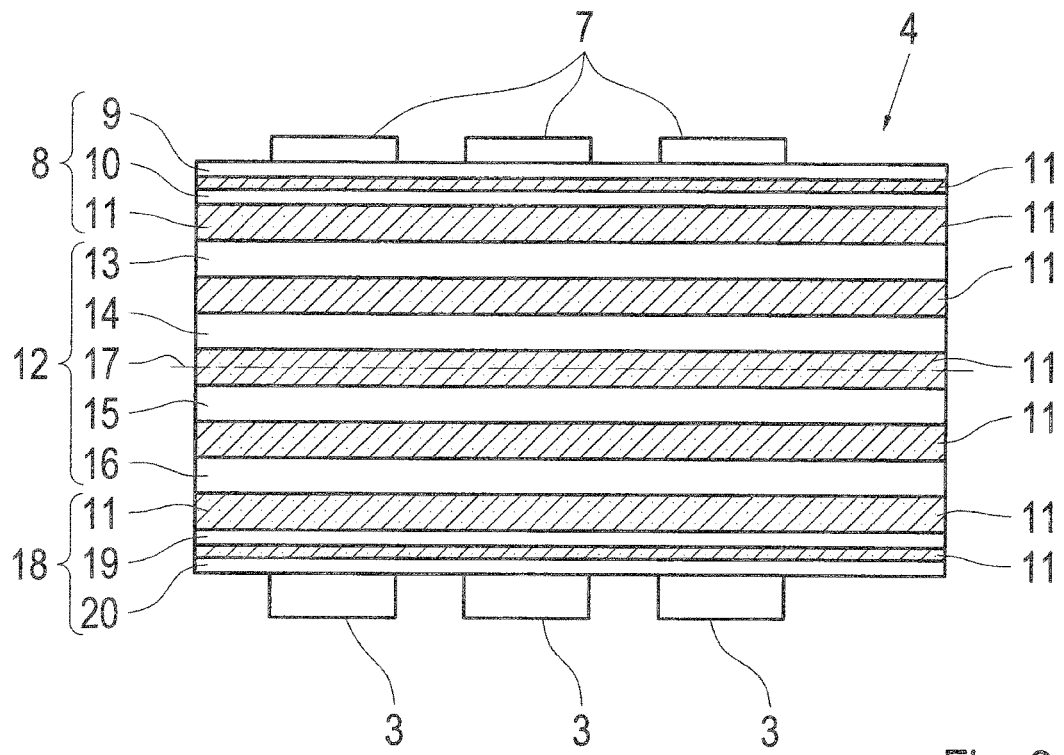
FIG. 2 shows a schematic side view of the high current circuit board according to FIG. 1.

FIG. 2 shows the multilayer structure of the high current circuit board 4. According to the schematic example in FIG. 2, three power circuit breakers 3 are provided on the high current circuit board 4. The power circuit breakers 3 are designed as power semiconductor devices. In particular, the power circuit breakers 3 are designed as a specialized version of a metal oxide semiconductor field effect transistor, which is also known as a power MOSFET. The power circuit breakers 3 are arranged on an underside of the high current circuit board 4 as shown in FIG. 2.

The high-current circuit board 4 has a plurality of layers, each fulfilling different functions. A control layer 8 shown in FIG. 4 at the top comprises two control layer thin strata 9, 10. At a top side opposite to the bottom side of the high current circuit board 4 three control elements 7 are provided. The first control layer thin stratum 9, which is arranged on the outside of the high current circuit board 4, carries the control elements 7. Between the first control layer thin stratum 9 and the second control layer thin stratum 10 is provided an insulating plastic layer 11. The plastic layer 11 serves to insulate the electrically conductive layers 9, 10. The plastic layer 11 is for example a plastic resin, in particular an epoxy resin. The control layer thin strata 9, 10 for example consist of copper and have a thickness of about 12 μm, 18 μm, 35 μm or 70 μm. At a bottom side of the second control layer thin stratum 10 facing away from the first control layer thin stratum 9 is provided another plastic layer 11 of the control layer 8.

At a side of the control layer 8 opposite to the outside of the high current circuit board 4 is provided a current conduction layer 12. The current conduction layer 12 comprises four strata 13, 14, 15 and 16, wherein two adjacent strata 13 and 14, 14 and 15, 15 and 16 as well as 16 and 17 are separated by a plastic layer 11.

The strata 13 to 16 are each designed as a copper layer and have a thickness of about 105 μm, 210 μm or a maximum of 400 μm. The two inner strata 14, 15 are designed as a current supply stratum. The current supply strata 14, 15 are connected to the current supply lines 5. Correspondingly, the two outer strata 13, 16 are designed as current return line strata. The current return line strata 13, 16 are connected to the current return line 6. The current supply strata 14, 15 are used for circuit board-internal current supply from the control elements 7 to the power circuit breakers 3 and back.

The current supply strata 14, 15 serve to connect the voltage source 2 to the electric load 1. The current return line strata 13, 16 are used for current return from the electric load 1 to the voltage source 2 through the high current circuit board 4. The current conduction layer 12 is arranged axis-symmetrically to a virtual center layer 17. The virtual center layer 17 is indicated in FIG. 2 by dashed lines. The virtual center layer 17 is arranged centrally in the plastic layer 11 which is disposed between the two current supply strata 14, 15.

A switching layer 18 connects to the current conduction layer 12. The switching layer 18 comprises two plastic layers 11 and two switching layer thin strata 19, 20, wherein on the first, outwardly arranged switching layer thin stratum 20 are arranged the power circuit breakers 3. The switching layer thin strata are made of copper and have a thickness of about 35 μm. A plastic layer 11 is provided between the two switching layer thin strata 19, 20.

Figure 3:
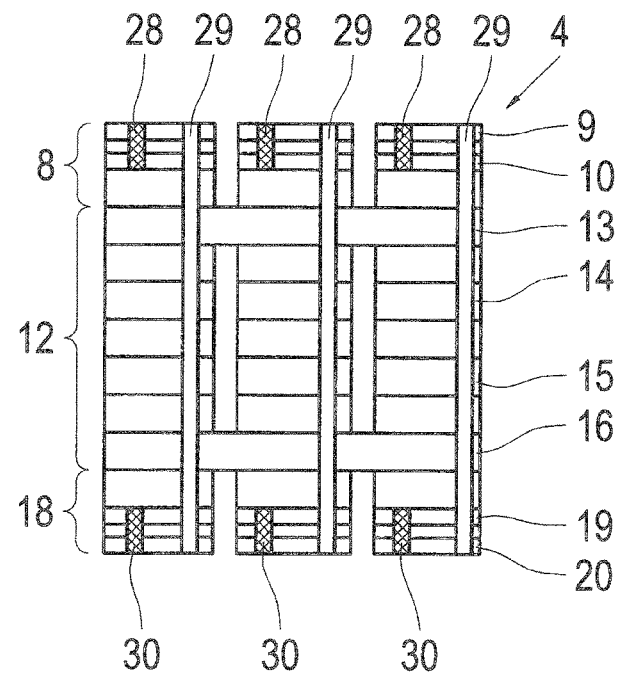
FIG. 3 shows a longitudinal section through the high current circuit board corresponding to FIG. 2.

In the following text, the connection of the layers 9, 10, 13 to 16, 19 and 20 is explained in more detail with reference to FIG. 3. It is apparent from FIG. 3 that each of the thin strata 9, 10 of the control layer 8 and each of the thin strata 19, 20 of the switching layer 18 are connected together by a non-continuous interlayer connection 28 and 30. The interlayer connection, which is also referred to as a VIA, is in particular a micro-VIA and is produced in particular by laser drilling. The micro VIA 28 connecting the control layer thin stratum 9, 10 is designed hollow. Furthermore, continuous interlayer connections 29 are provided that penetrate the high current circuit board 4 through all layers. The switching layer thin strata 19, 20 are interconnected by micro-VIA 30. The micro-VIA 30 are designed substantially analogously to the micro-VIA 28, wherein the micro-VIA 30 are filled with copper. The interlayer connections 30 are referred to as micro-VIA-fill. The internal current supply strata 14, 15 serve for current supply to the externally mounted electric load 1. The current supply strata 14, 15 serve as positively connected potential areas for current supply in the high current circuit board 4. The current return line strata 13, 16 are used for current return. At the same time, the current return line strata 13, 16 are designed continuous and represent a first and a second shielding element to shield the current conduction layer 12 from the control layer 8 and from the switching layer 18. The shielding elements 13, 16 are thus designed integrated in the current conduction layer 12.

The power circuit breakers 3 allow a connection to a heat sink such as a cooling element via thermal compounds or thermal pads. The power circuit breakers 3 are particularly characterized by high current change rate per time unit. Such current changes are not problematic due to the shielding of the current conduction layer 12. In particular, a skin effect is excluded due to an increased stratum sectional area.

In the following text, the current conduction in the high current circuit board 4 is explained in detail with reference to FIG. 4. The essential structure of the high current circuit board 4 corresponds to the previous representations illustrated in particular in FIG. 2 and FIG. 3. On a top side of the high current circuit board 4 is provided a control element 7 by way of example. There can be provided also further control elements 7 on the first control layer thin stratum 9.

On the bottom side of the high current circuit board 4, the power circuit breakers 3 are mounted on the first switching layer thin stratum 20. The current supply from the control element 7 to the power circuit breakers 3 is ensured by a current supply line 31 arranged on the first control layer thin stratum 9 illustrated in FIG. 4 on the left. The current supply line 31 leads through the control layer 8 with the control layer thin strata 9, 10 and the first shielding element in the form of the current return stratum 13 to the current supply thick stratum 15. The current supply thick stratum 15 defines a circuit board-internal current supply direction 32. At one end shown on the left, the current supply thick stratum 15 comprises a maximum strata cross-sectional area. In this range, the current supply thick stratum 15 is suited to conduct maximum current. A current component required for switching the power circuit breaker 3 shown in FIG. 4 on the left is conducted by the current supply line through the current return stratum 16 the power circuit breakers 3. This diverted current portion need not be conducted in the further course through the current supply thick stratum 15 in the current supply direction 32. Accordingly, after the turn of the current supply line 31 to the first power circuit breaker 3, the current supply thick stratum 15 has a reduced sectional area. In particular, after the turn of the current supply line 31, the stratum cross-sectional area of the current supply thick stratum is reduced by exactly the sectional area portion, which is needed for the supply of the first power circuit breaker 3. In the current supply direction 32, the stratum sectional area of the current supply thick stratum 15 gradually decreases. As shown in FIG. 4, the current supply thick stratum has a step-shaped structure in the current supply direction 32. It is also possible that the stratum sectional area along the current supply thick stratum 15 decreases continuously, and is thus designed in a ramp shape. Accordingly, the stratum sectional area increases in a circuit board-internal current return direction 34 of the current supply thick stratum 14. The current supply thick stratum 14 is connected via a current return line 33 to the control layer thin strata 9, 10 of the control layer 8.

Figure 4:
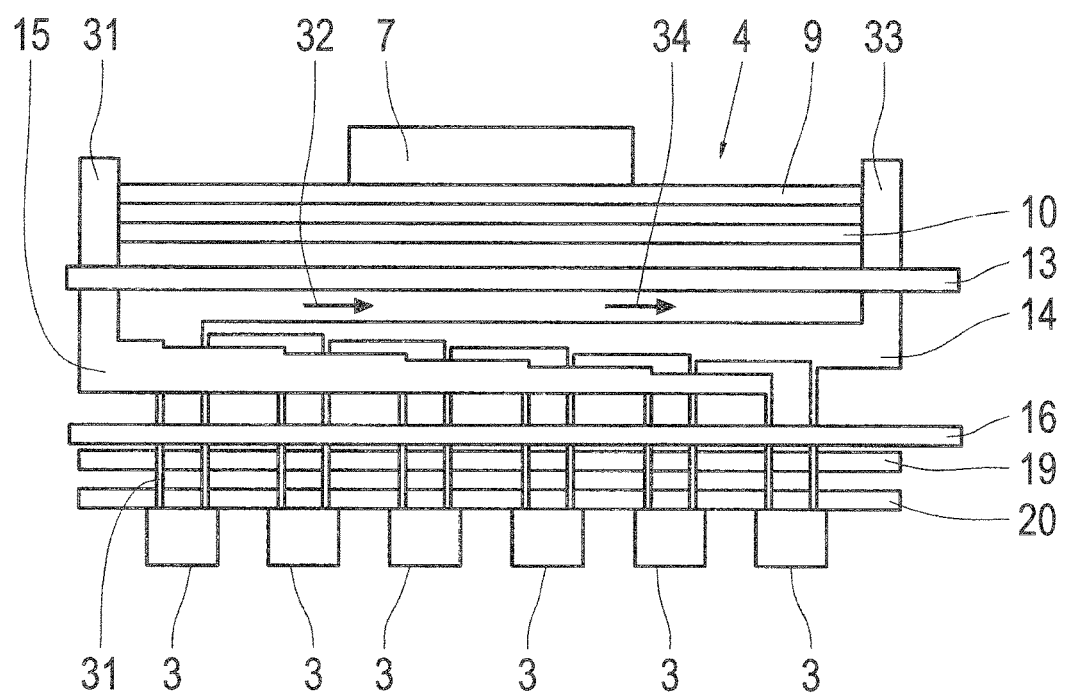
FIG. 4 shows a functional schematic representation of the functional layers of the disclosed multi-functional high current circuit board.

According to FIG. 4, both the current supply thick stratum 15 in the circuit board internal current supply direction 32 and the current supply thick stratum 14 in the circuit board internal current return direction 34 are respectively step-shaped, i.e. stepwise variable with respect to the stratum sectional area. In particular, the current supply strata 14, 15 are designed and arranged in the high current circuit board 4, in particular in the current conduction layer 12 such that a total stratum sectional area which corresponds to the sum of the stratum sectional areas of the current supply strata 14, 15 is substantially constant in the current conduction directions 32, 34. This is made possible in particular in that in the rate in which the stratum sectional area of the current supply thick stratum 15 gradually decreases, the stratum sectional area of the current supply thick stratum 14 gradually increases. This makes it possible to arrange the two current supply strata 14, 15 in particularly space-saving and compact manner in the high current circuit board 4.

Assuming that the current required for each power circuit breaker 3 is identical in each case, the maximum stratum sectional area amounts to the sum of the individual cross-sectional areas which are necessary for conducting the individual current.

REFERENCE NUMERALS

1 Electric load
2 Voltage source
3 Power circuit breaker
4 High current circuit board
5 Current supply line
6 Current return line
7 Control element
8 Control layer
9 First control layer thin stratum
10 Second control layer thin stratum
11 Plastic layer
12 Current conduction layer
13 Current return stratum
14 Current supply thick stratum
15 Current supply thick stratum
16 Current return stratum
17 Virtual center layer
18 Switching layer
19 Second switching layer thin stratum
20 First switching layer thin stratum
28 Micro-VIA between the control layer thin strata 9, 10
29 Interlayer connection
30 Micro-VIA fill between the switching layer thin strata 20, 19
31 Current supply line
32 Circuit board-internal current supply direction
33 Current return line
34 Circuit board-internal current return direction

The invention claimed is:

1. A multi-functional high current circuit board comprising:
   a current conduction layer comprising a plurality of strata for the conduction of electric current,
   a switching layer comprising at least one power circuit breaker for switching an electric load,
   a control layer comprising at least one control element for switching the at least one power circuit breaker,
   at least one shielding element for shielding the current conduction layer from the control layer and from the switching layer,
   wherein the current conduction layer comprises at least one current supply thick stratum for supplying current from a voltage source connectable to the high current circuit board through the high current circuit board to an electric load connectable to the high current circuit board is provided, and at least one current return stratum for conducting current back from the electric load through the high current circuit board to the voltage source is provided,
   wherein a first current supply thick stratum has a stratum sectional area that decreases in a circuit board-internal current conduction direction, wherein a second current supply thick stratum has a stratum section area that increases in the circuit board-internal current conduction direction.

2. The high current circuit board according to claim 1, wherein the current conduction layer comprises at least four strata.

3. The high current circuit board according to claim 2, wherein the at least four strata are symmetrically arranged such that the electromagnetic fields caused by each strata are directed opposite to one another and compensate each other.

4. The high current circuit board according to claim 2, wherein the current conduction layers are built alternately from the current supply stratum and the current return strata.

5. The high current circuit board according to claim 1, wherein the at least four strata each are made of copper and have a constant thickness of about 105 μm to a maximum of 400 μm, in particular 105 μm, 210 μm or 400 μm.

6. The high current circuit board according to claim 1, further comprising a first shielding element for shielding the current conduction layer from the switching layer and a second shielding element for shielding the current conduction layer from the control layer.

7. The high current circuit board according to claim 6, wherein the first shielding element is a thick stratum of the current conduction layer adjacent to the switching layer and the second shielding element is a thick stratum of the current conduction layer adjacent to the control layer.

8. The high current circuit board according to claim 1, wherein the switching layer comprises at least two switching layer thin strata, wherein the at least one power circuit breaker is mounted on a first switching layer thin stratum and wherein the first switching layer thin stratum is conductively connected to a second switching layer thin stratum.

9. The high current circuit board according to claim 8, characterized in that the at least two switching layer thin strata are connected by at least one interlayer connection, wherein the at least one interlayer connection is filled with copper.

10. The high current circuit board according to claim 8, characterized in that the switching layer thin strata each comprise copper and have an constant thickness of about 12 μm to a maximum of 70 μm, in particular 12 μm, 18 μm, 35 μm or 70 μm.

11. The high current circuit board according to claim 1, wherein the control layer comprises at least two control layer thin strata, wherein on a first control layer thin stratum the at least one control element is mounted and wherein the first control layer thin stratum is conductively connected to the second control layer thin layer.

12. The high current circuit board according to claim 11, wherein the at least two control layer thin strata are connected by at least one interlayer connection, wherein the at least one interlayer connection is hollow.

13. The high current circuit board according to claim 11, wherein the control layer thin strata each consist of copper and each have a constant thickness of about 12 μm to a maximum of 70 μm, in particular 12 μm, 18 μm, 35 μm or 70 μm.

14. The high current circuit board according to claim 1, wherein the sum of the stratum sectional area of the first current supply thick stratum and the stratum sectional area of the second current supply thick stratum is constant in the circuit board-internal current conduction direction.

15. The high current circuit board according to claim 1, wherein a continuous interlayer connection penetrates through all layers of the high current circuit board.

16. The high current circuit board according to claim 1, wherein the first current supply line leads through the control layer and the at least one current return stratum to the first current supply thick stratum.

17. The high current circuit board according to claim 16, wherein a second current supply line leads through the control layer and the at least one current return stratum to the second current supply thick stratum.

\* \* \* \* \*